United States Patent [19]

Ludwig et al.

[11] Patent Number: 5,000,208

[45] Date of Patent: Mar. 19, 1991

[54] WAFER RINSER/DRYER

[75] Inventors: Bryan J. Ludwig; David A. Cathey; Ernest E. Marks; Leo B. Jurica; L. Brian Dunn; Loyal R. Gibbons, all of Boise, Id.

[73] Assignee: Micron Technology, Inc., Boise, Id.

[21] Appl. No.: 541,642

[22] Filed: Jun. 21, 1990

[51] Int. Cl.$^5$ .............................................. B08B 3/02
[52] U.S. Cl. ................... 134/58 R; 134/113; 134/115 R; 134/147; 134/200; 134/99; 134/151; 134/902
[58] Field of Search ............ 134/73, 57 R, 133, 58 R, 134/13, 115, 113, 99, 147, 184, 200, 138, 140, 151; 68/3 R

[56] References Cited

U.S. PATENT DOCUMENTS

| | | | |
|---|---|---|---|
| 3,893,867 | 7/1975 | Mayer | 134/184 |
| 4,208,760 | 6/1980 | Dexter et al. | 134/133 X |
| 4,286,541 | 9/1981 | Blackwood | 134/902 X |
| 4,520,834 | 6/1985 | DiCicco | 134/13 |
| 4,602,614 | 7/1987 | Silvernail et al. | 134/99 |
| 4,722,355 | 2/1988 | Moe et al. | 134/73 |
| 4,731,154 | 3/1988 | Hazlitt et al. | 134/113 X |
| 4,816,081 | 3/1989 | Mehta et al. | 134/147 |

Primary Examiner—Frankie L. Stinson
Attorney, Agent, or Firm—Stanley N. Protigal; Angus C. Fox, III

[57] ABSTRACT

Improvements to an integrated circuit wafer rinsing and washing machine which include a streamlined housing for low turbulence air flow, improved rear maintenance capability, improved wafer carriers, foot operated switches and improved rotating part fastening means.

11 Claims, 6 Drawing Sheets

WAFER RINSER/DRYER

BACKGROUND OF THE INVENTION

This invention relates to an improved apparatus that rinses chemicals from semiconductor wafers and then dries the wafers using an inert heated gas. The apparatus utilizes a spin process for both the rinse and dry cycles.

The process of manufacturing integrated circuit (IC) chips consists of coating, etching and cleaning semiconductor wafers which later in the process are carefully cut into small chips or die. One of the critical steps in this process is the cleaning process which follows chemical etching. The cleaning process includes loading the wafers into a wafer carrier, placing the wafer carrier in a spin rinser/dryer, rinsing the wafers in deionized (DI) water while spinning, and drying the wafers by passing an inert heated gas over the wafers while still spinning. The cleanliness of the water can be monitored during the rinse cycle by a resistivity measuring means that interlocks the rinser/dryer so that it does not go into a dry cycle until the water reaches a predetermined resistivity, indicating a proper water cleanliness. The wafer manufacturing and cleaning processes are generally carried out in cleanrooms which often exceed the cleanliness requirements of a hospital operating room. This super cleanliness insures that wafers do not become contaminated by particulate matter. Consequently, great emphasis is placed on using dust free materials and maintaining a dust free environment. Careful attention is paid to ventilation systems in order to minimize contaminating this clean environment.

U.S. Pat. No. 4,300,581 issued Nov. 17, 1981 discloses an automatic centrifugal wafer processor. The processor features include an inclined stainless steel tub, an automatic rinse termination timer, a liquid conductivity monitoring means, a wafer support device, a drive motor and a glass viewing window in the front opening door. This type of commercially available processor, although adequate for the applicant's needs is characterized by a number of problems namely:

1. The shape of the outer front housing has sharp bends that create turbulence in a down flow air ventilation system typical in a cleanroom. Turbulent air in a cleanroom is undesirable since it stirs up any dust that may be present.

2. The outer housing does not provide an easy access to interior controls, valves, motor, and bearings for maintenance.

3. The outer housing shape does not lend itself to placing the front of the processor in a cleanroom and the back of the unit behind a walled corridor, or plenum (maintenance area), not necessarily a clean area.

4. Maintenance on the apparatus is difficult by virtue of the housing construction and the rotating tub being mounted on four shock mounts.

5. Although not shown in U.S. Pat. No. 4,300,581, the plumbing fixtures, including nitrogen supply, water supply, and water drain piping all are supported from the back of the machine and have to be dismantled prior to performing any maintenance on the machine internal devices.

6. One hand must be free in order to open the door or start the machine by actuating the push button. This restricts the operator from carrying more than one wafer support carrier unless one of the carriers is set down.

7. The wafer support device (that holds the wafers in their respective slots in the carrier), consists of a plastic coated bent steel rod, that attaches to a support ring on the front and a rotor on the back. If the plastic coating is damaged, the entire rotor, support ring, etc. has to be removed in order to undo the bent steel rod fastener at the back of the rotor and then replace the damaged plastic coating.

8. The single alarm point resistivity monitor can give a false high reading, indicating clean water in the case when there is no water surrounding the probe, i.e., the monitor probe is in air.

9. The bowl drain has a square cross-section causing difficult cleaning of the square edges during maintenance periods.

10. Although not specifically shown or stated in the prior art figures, the drive motors have typically been a brush type D.C. motor since the required variable speeds are most easily accomplished by D.C. motors. One of the problems created by theses D.C. motors is generation of carbon dust as the brushes wear on the commutator. Carbon dust in the clean area creates a contamination hazard for the process.

11. A subsequent later version of the wafer processor contains a rotor quick disconnect device that has failed. This device disconnected the rotor from an in-line motor shaft by means of an expansion ring that contracted and expanded within the motor shaft. A failure of the disconnect device during operation causes internal damage to the carousel and stainless steel bowl.

It is the purpose of this invention to correct the problems identified above by an apparatus that has a unique housing, improved maintenance accessibility to internal parts from a non-cleanroom plenum, improved wafer carrier holders (carousels), foot-operated switches for the door, a means for monitoring water cleanliness that identifies a lack of water, and an improved quick disconnect rotor means.

SUMMARY OF THE INVENTION

The apparatus housing has been designed to improve air flow patterns over the front of the rinser/dryer by having a housing with a slanted upper front section and a vertical lower front section without any significant obstructions or sharp corners that have existed in some of the prior art apparatus. This streamlined configuration allows laminar flow from the ceiling supply ducts, down the upper and lower sections and into a floor exhaust grating and subsequently to the exhaust.

Maintenance of the housing on interior components is enhanced by having no back panel. The cabinet rear section is accessed through the plenum (maintenance area). The new housing profile looking from the front is a rectangular shape which allows easy placement in a rectangular wall cut out. This simple feature permits the front section to be in a clean area and the rear section to be in a maintenance alley or plenum. Maintenance from the back on the bowl and motor is also enhanced by having a bowl frame that slides out the housing back on a track allowing total replacement of the motor, bowl and carousel in a short period.

The maintenance of interior components has also been improved by not having the utility connections hanging from the back panel, a condition in the prior art that required disassembly of piping prior to gaining access to the interior. Access has been further enhanced by eliminating the rear panel which is in the plenum. Maintenance from the plenum is periodically required on the DI water, and nitrogen valves which are typically operated by air solenoid valves. Additionally, each air solenoid valve (electrically operated) has an LED indicator light that informs maintenance personnel working in the plenum, of proper air solenoid sequencing. Manual activation of air solenoid valves is also possible, permitting functional testing of the water and nitrogen valves.

In the case where later model washer/dryer bowls are stacked one above the other in a common housing, the inclusion of foot-operated door switches makes it possible to handle two wafer carriers at once and open the doors at the same time. An additional foot-operated machine start switch will start the machine.

Ease of replacing the plastic coating on the wafer support rod has been accomplished by use of slide-on or snap-on straight pieces of teflon tubing and a pair of straight rods in lieu of the bent steel rod of the prior art. The straight rods are welded into a counterbore in a rotor back plate and are held in place by retainers on a support ring at the front.

The failure of the quick disconnect device connecting the D.C. brushless motor to the carousel has been corrected by a simple tapered end rod that fits snugly in the bored shaft of the brushless motor and connects to the carousel shaft by a shoulder bolt with an O-ring seal.

A false high resistivity reading on the resistivity monitor is corrected by the use of an acceptance band of resistivity. A theoretical maximum expected resistivity for deionized water at 25° C. can be shown to be 18.3 megohms. A useful acceptance band is from about 15 megohms to about 18 megohms. Resistivities below 15 megohms indicate excessive dirtiness in the discharge. Resistivities above 18 megohms indicate an air bound condition which can occur during a rinse water drain cycle or a rinse manifold nitrogen purge cycle. A preferred probe and enclosure are disclose in U.S. Pat. No. 4,872,356, "Resistivity Probe Fixture", by Barnett et al. ("Barnett"), herein incorporated by reference. Using this acceptance band, a lockout is further incorporated to prevent further use of the rinser/dryer if malfunction occurs.

The bowl drain cleaning task has been improved by making the drain have a smooth transition from circular bowl to drain.

The generation of carbon dust within the apparatus has been eliminated by the use of a D.C. brushless motor, controlled by a static motor control system.

DETAILED DESCRIPTION OF THE INVENTION

Figure 1:
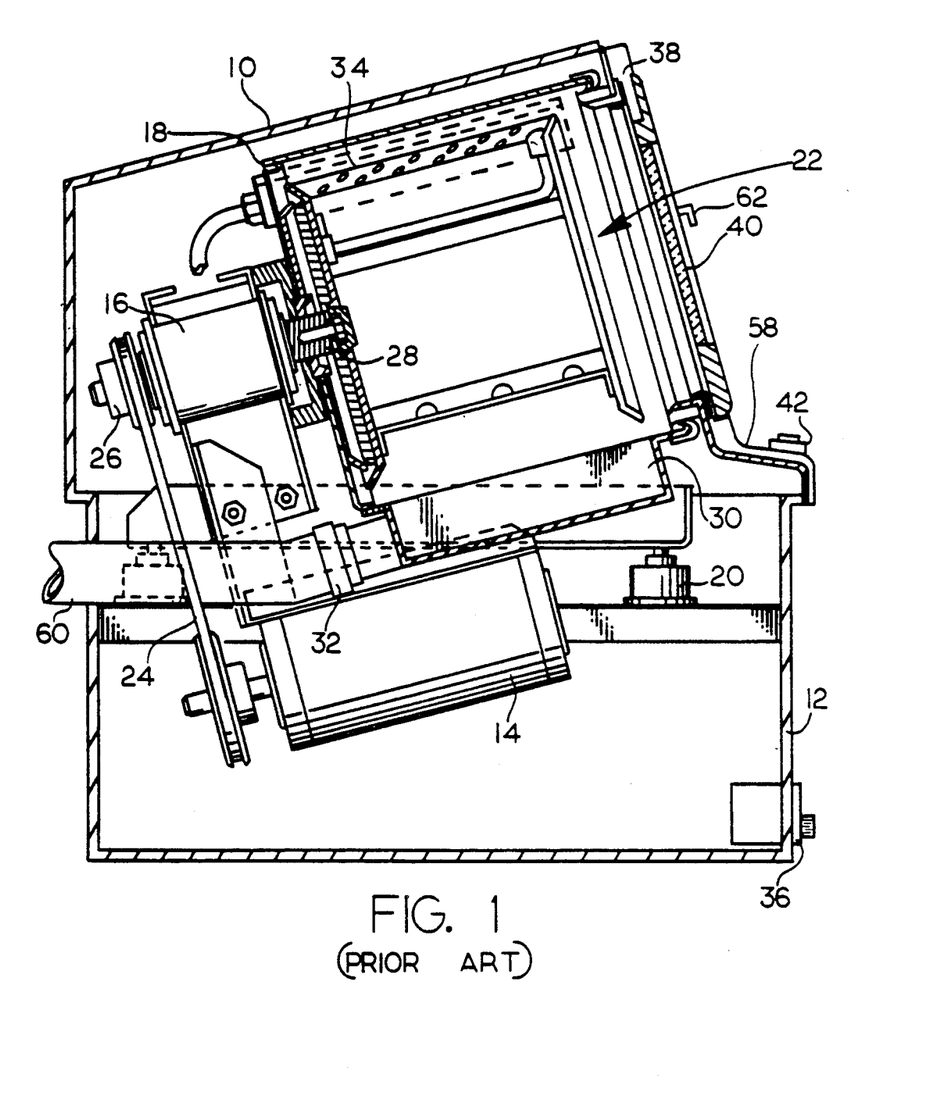
FIG. 1 is a cross-section drawing of a prior art centrifugal wafer processor.

In order to understand the nature of the improvements of the present invention, a description of the prior art centrifugal wafer processor will be given by referring to FIG. 1. Upper housing 10 covers the internal mechanical apparatus and fastens to lower housing 12 which in turn supports a motor 14, bearing 16, and a tub 18 at shock mounts 20 (2 of 4 are shown). Carousel assembly 22 is mounted within tub 18 and rotated by motor 14 via belt 24, pulley 26 and axle 28 (although not shown in the prior art figures, a direct drive between motor 14 and carousel assembly 22 has also been implemented). A square drain box 30 connects at the bottom of the tub and drains water through DI water resistivity probe 32 and out drain 60. DI water is sprayed on the carousel assembly 22 through a pair of spray members 34 or alternatively nitrogen may be purged through these same spray members 34. The location for both the rinse and dry timers and rpm controls are shown at 36. Access to the tub 18 and carousel assembly 22 and provided by door 38 having a viewing window 40. The push button start/stop switch 42 is shown below the door 38.

Figure 2:
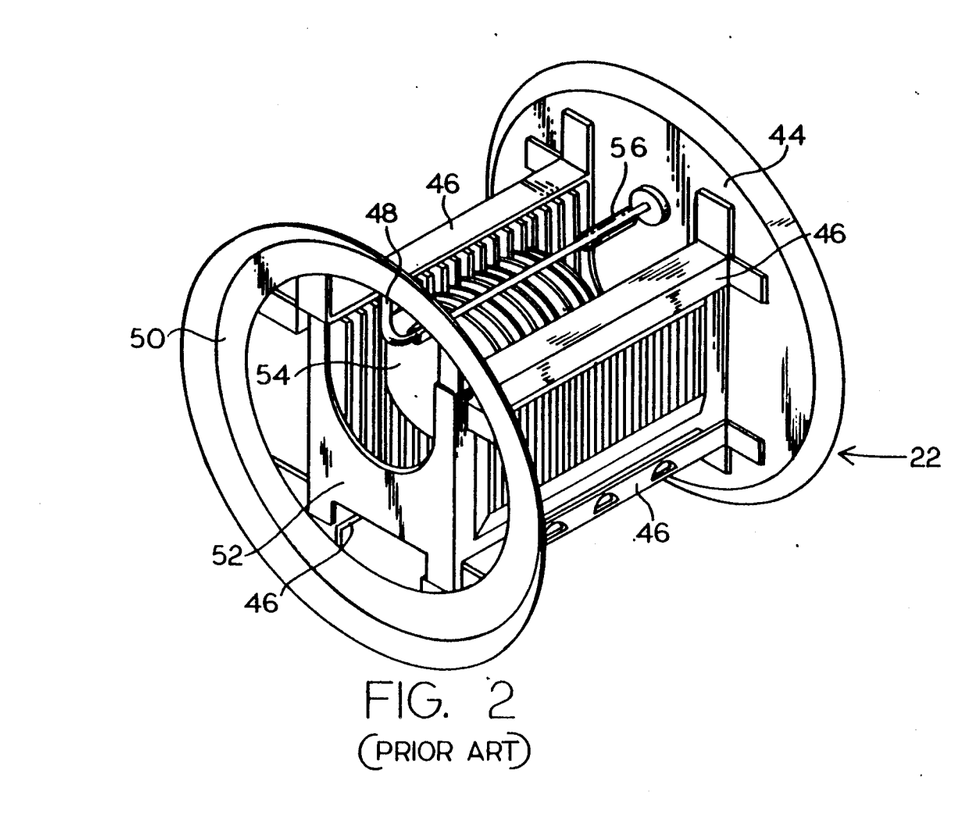
FIG. 2 is a perspective drawing of a carousel assembly of the prior art processor.

The details of the prior art carousel assembly 22 can be seen by referring to FIG. 2. Rotor 44, which connects to the axle 28 of FIG. 1, is a supporting base plate for four support members 46 and a support rod 48. The support rod 48 and support members are connected at their opposite ends to a support ring 50. Wafer carrier 52, which slides into and is held by the four support members 46, carries the IC wafers 54 that are being rinsed and later dried. The wafers are held in place by the support rod 48 which has a plastic coating 56.

Referring to FIG..1, it is noted that turbulent air flow can result from ceiling ducts when it passes over the sharp bends of upper housing 10 illustrated at 58. Also, it can be seen that access to the interior controls, valves, motor, and bearings for maintenance requires vertical removal of the upper housing 10. Access to the motor 14 is difficult since, for example, it may be suspended below the tub 18 as shown. In this case, the motor 14 removal requires disconnecting the entire interior assembly from the shock mounts 20 which in turn require removal of the back mounted plumbing 60. This upper housing 10 removal also precludes installation of the unit into a cleanroom wall. Hand operated door latch 62 and push buttons 42 require one free hand of the operator.

Figure 3:
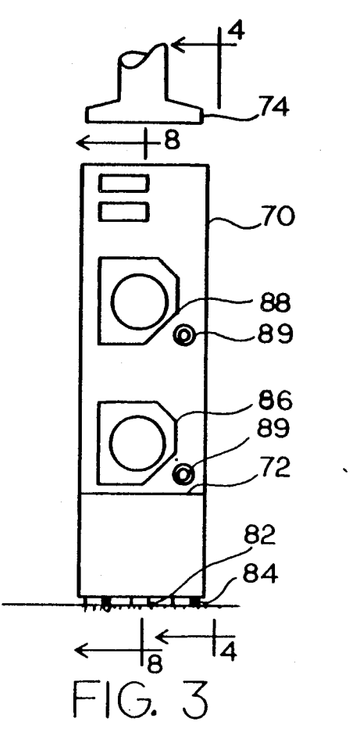
FIG. 3 is a front elevation of the wafer rinser/dryer of the present invention.
Figure 4:
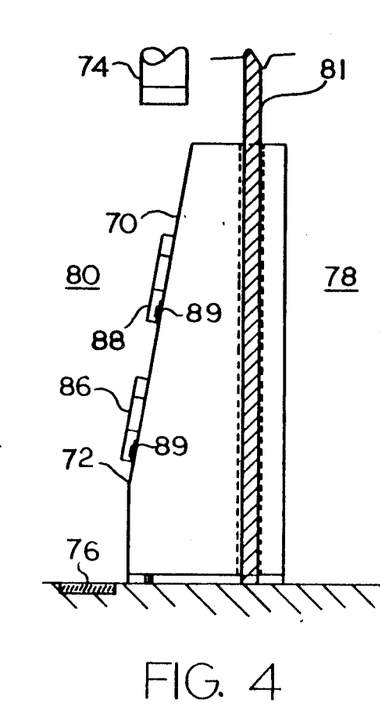
FIG. 4 is a side elevation of the rinser/dryer of the present invention.

The improvements can be seen by referring to the present invention in FIGS. 3 and 4. The housing 70 streamlined shape at 72 reduces air turbulence from ventilation duct 74 as the air passes over the front of the housing 70, and down through exhaust floor grate 76. Access to the controls, motor, valves, etc., is provided through an open rear section at plenum 78 which is separated from clean area 80 by wall 81. The acid-resistant foot actuated kick switches 82, 84 are shown at the base of housing 70. Pressing at switch 82 once opens door 86, and pressing again closes door 86. A similar set of switches can open and close the second door 88 in the case of stacked bowls. Switch 84 is the start switch that starts or stops the machine. A hand-operated stop switch 89 is located adjacent the doors.

Figure 5:
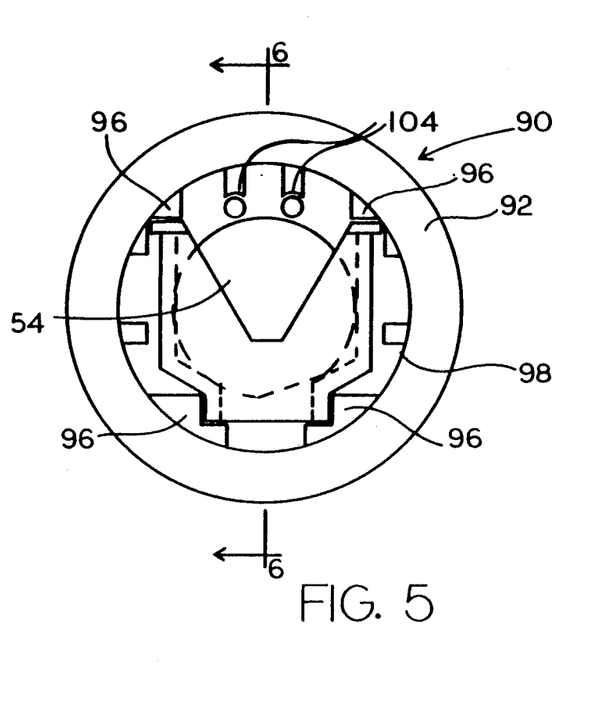
FIG. 5 is a front elevation of the carousel assembly of the present invention.
Figure 6:
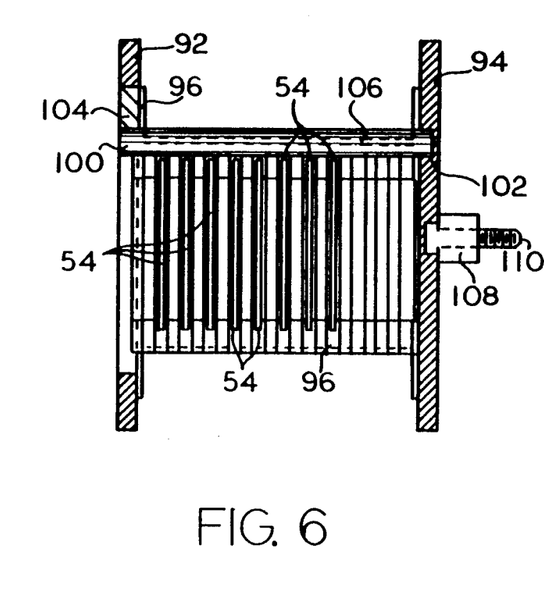
FIG. 6 is a cross-section view through FIG. 5 of the carousel assembly of the present invention.

FIGS. 5 and 6 illustrated the improvements to the wafer support rod means of the carousel 90. The rotor front plate 92 and rotor back plate 94 are both connected to each end of support members 96 as in the prior art. The wafers 54 in wafer carrier 98 are retained in the carrier by a pair of support rods 100, yet still able to rotate within the carrier. One end of the support rod 100 is inserted into bored cavity 102 and then welded in the rotor back plate 94. The opposite end is supported by a support rod retainer 104 extending down from rotor front plate 92. Teflon tubing 106 is inserted over the support rods 100 and bears against and supports the top of the wafers 54 and at the rotor front plate end, they bear against the support rod retainer during spin cycles. Tubing 106 is exchanged by sliding the teflon tubing 106 over the support rods 100. The tubing 106 can be rotated one quarter turn when the bottom side wears thereby quadrupling the tube life. Tubing 106 can alternately be slit down one side and snapped onto support rods 100.

Figure 7:
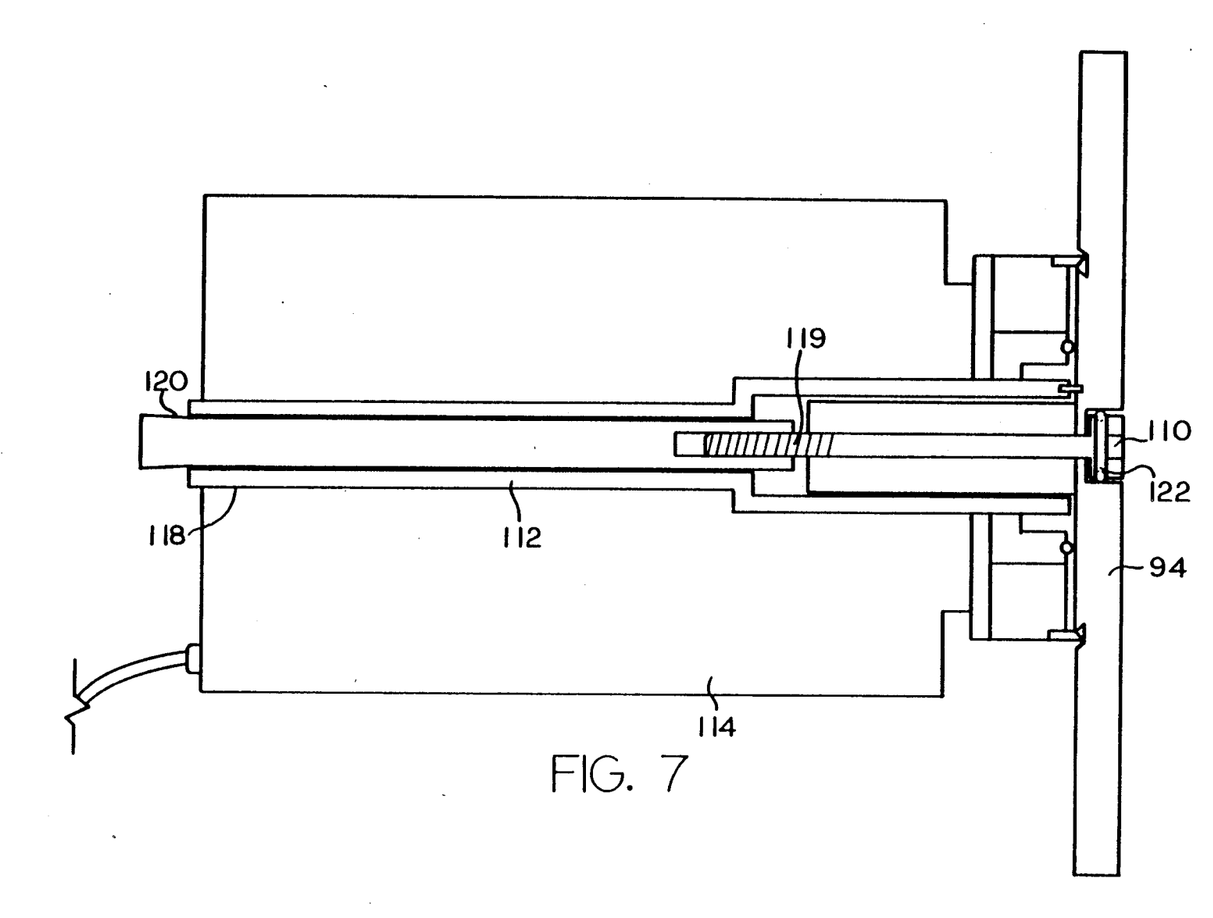
FIG. 7 is a section view through the D.C. brushless motor of the present invention.
Figure 8:
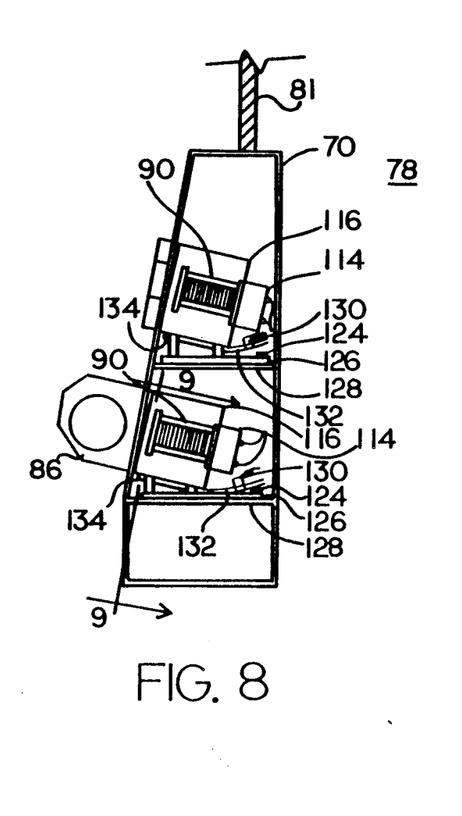
FIG. 8 is a section view through FIG. 3 of the processor of the present invention.
Figure 9:
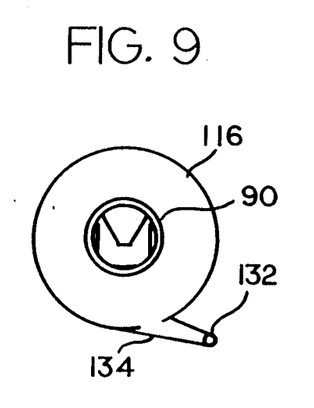
FIG. 9 is a section view through FIG. 8 and illustrates the bowl and bowl drain of the present invention.

Referring to FIGS. 6 and 7, the carousel shaft 108 and shoulder bolt 110 that connect the rotor back plate 92 to the motor shaft illustrate an improvement in fastening the carousel 90 to motor 114, that prevents the carousel 90 from coming loose from motor 114 and thereby causing damage to the carousel 90 and the tub 116 illustrated in FIG. 8.

FIG. 7 illustrates how rotor back plate 94 is secured to motor shaft 112 by means of a 5/16-inch shoulder bolt 110 that threads into a threaded aperture in carousel retainer 118 at 119. The cylindrical carousel retainer 118 is secured inside the motor shaft by a taper shown conceptually at 120. Shoulder bolt 110 is machined on the head of the bolt to contain an O-ring 122 which prevents rinse water leakage into the motor 114 and motor shaft 112.

Maintenance access from the plenum 78 is illustrated in FIG. 8. This figure also illustrates the location of a pair of bowl removal bolts 124 that when removed, allow the whole bowl 116 and motor 114 which are mounted on bowl frame 126, to be slid out into plenum 78 on track 128. It is therefore possible to easily work on motor 114 or to replace the entire assembly in a short period.

Resistivity probe 130 is shown conceptually in FIG. 8, attached to drain 132. Probe 130 actually appears as shown and described in Barnett. The output of probe 130 is monitored by a monitor (not shown). A resistivity acceptance band, of about 15 megohms to about 18 megohms, is established in combination with a lockout procedure. Less than 15 megohms indicates excessively dirty discharge. 18 megohms indicate pure DI water. More than 18 megohms indicates an air bound condition at probe 130, or malfunction of probe 130 or its associated monitor. Air binding can occur at the end of the rinse cycle. When the water resistivity is within the acceptance band, the rinse cycle is permitted to terminate and the dry cycle to commence. If less than 15 megohms (or a value commensurate with the needs of the process) is detected at time-out of rinse, rinse continues until manually overridden, dry occurs, and subsequent loads are prohibited. The rational for this is that less than 15 megohms indicates excessive contamination in the discharge, and if the contamination is not cleared in a predetermined amount of time, something abnormal has occured, such as a broken wafer or rinser/dryer malfunction. If more than 18 megohms (or a value commensurate with the fluid being delivered to the rinser/dryer) is detected at time-out of rinse, dry is allowed, but alarm is given, and processing is disabled for subsequent loads. The indication here is air binding, for example, requiring the attention of maintenance personnel.

Clearly, equivalent components and/or methodology may be incorporated without exceeding the bounds of these claims.

We claim:

1. In a wafer rinser/dryer containing at least one machine that rinses wafers in a wafer carrier in deionized (DI) water and then dries them by means of blowing gas over them, wherein the wafers are loaded through a front door into a carousel having a wafer restraining support rod and rotated within a fixed bowl during rinse and dry cycles of operation:

a housing for the machine, having a streamlined front section and an open rear section wherein the machine may be placed in a cut-out in a wall and maintained from behind the wall;

a kick switch and means whereby pressing the switch a first time opens the front door and pressing a second time closes the door;

a kick switch and means whereby pressing the switch starts the machine;

a removable teflon tube surrounding the support rod;

a carousel retainer that rigidly and boltably connects rotating means to the carousel, having a taper at a first end and a threaded aperture at a second end for rigid and botable connection; and a bowl drain connecting to the bowl, wherein there is a smooth transition from bowl to bowl drain, to facilitate discharge;

wherein the rotating means is a D.C. brushless motor, to minimize particle generation; and wherein the bowl, motor, and carousel are mounted on a bowl frame which rests on a track so that the bowl frame may be slid out from the open rear section for maintenance.

2. A rinser/dryer as recited in claim 1, further comprising discharge resistivity measuring means, so that the machine can be locked out when discharge resistivity is outside of a resistivity acceptance band, wherein when discharge resistivity is below the resistivity acceptance band, the machine continues rinsing until manually overridden, then dries, and then locks out from further rinsing and drying, and wherein when discharge resistivity is above the resistivity acceptance band, the machine completes its rinsing and drying cycles, and then locks out from further rinsing and drying.

3. A rinser/dryer as recited in claim 2, wherein the resistivity acceptance band is about 15 megohms to about 18 megohms.

4. In a wafer rinser/dryer containing at least one machine that rinses wafers in a wafer carrier in deionized (DI) water and then dries them by means of blowing gas over them, wherein the wafers are loaded through a front door into a carousel having a wafer restraining support rod and rotated within a fixed bowl during rinse and dry cycles of operation:

a housing for the machine, having a streamlined front section and an open rear section wherein the machine may be placed in a cut-out in a wall and maintained from behind the wall;

foot-operated means to open the front door;

foot-operated means to start the machine;

a removable teflon tube surrounding the support rod;

a carousel retainer that rigidly and botably connects rotating means to the carousel; and a bowl drain connecting to the bowl, wherein there is a smooth transition from bowl to bowl drain, to facilitate discharge.

5. A rinser/dryer as recited in claim 4, wherein the foot-operated door opening means is a kick switch whereby pressing the switch a first time opens the door and pressing a second time closes the door.

6. A rinser/dryer as recited in claim 4, wherein the foot-operated starting means is a kick switch whereby pressing the switch starts the machine.

7. A rinser/dryer as recited in claim 4, wherein the carousel retainer has a taper at a first end and a threaded aperture at a second end for rigid and botable connection.

8. A rinser/dryer as recited in claim 4, wherein the rotating means is a D.C. brushless motor, to minimize particle generation.

9. A rinser/dryer as recited in claim 4, wherein the bowl, motor, and carousel are mounted on a bowl frame which rests on a track so that the bowl frame may be slid out from the open rear section for maintenance.

10. A machine as recited in claim 4, further comprising discharge resistivity measuring and lockout means, so that the machine can be locked out when discharge resistivity is outside of a resistivity acceptance band, wherein when discharge resistivity is below the resistivity acceptance band, the machine continues rinsing until manually overridden, then dries, and then locks out from further rinsing and drying, and wherein when discharge resistivity is above the resistivity acceptance band, the machine completes its rinsing and drying cycles, and then locks out from further rinsing and drying.

11. A machine as recited in claim 10, wherein the resistivity acceptance band is about 15 megohms to about 18 megohms.

* * * * *

UNITED STATES PATENT AND TRADEMARK OFFICE
CERTIFICATE OF CORRECTION

PATENT NO. : 5,000,208
DATED : March 19, 1991
INVENTOR(S) : Bryan J. Ludwig et al It is certified that error appears in the above-indentified patent and that said Letters Patent is hereby corrected as shown below:

Column 2, line 22, delete "theses" and insert -- these --;

Column 3, line 39, delete "disclose" and insert -- disclosed --;

Column 7, line 15, delete "botable" and insert -- boltable --.

Signed and Sealed this

Eighteenth Day of January, 1994

Attest:

BRUCE LEHMAN

Attesting Officer  Commissioner of Patents and Trademarks